United States Patent [19]

Hoffman et al.

[11] Patent Number: 5,506,446
[45] Date of Patent: Apr. 9, 1996

[54] ELECTRONIC PACKAGE HAVING IMPROVED WIRE BONDING CAPABILITY

[75] Inventors: Paul R. Hoffman, Modesto; George A. Brathwaite, Hayward; Doanh D. Bui, Milpitas, all of Calif.; Deepak Mahulikar, Madison, Conn.

[73] Assignee: Olin Corporation, Manteca, Calif.

[21] Appl. No.: 450,292

[22] Filed: May 25, 1995

Related U.S. Application Data

[63] Continuation of Ser. No. 227,754, Apr. 14, 1994, abandoned.

[51] Int. Cl.$^6$ .......................... H01L 23/06; H01L 23/10
[52] U.S. Cl. ........................ 257/674; 257/669; 257/668; 257/698
[58] Field of Search .................... 257/668, 690, 257/691, 666, 669, 696, 672, 673, 674, 677, 698, 701, 702

[56] References Cited

U.S. PATENT DOCUMENTS

| | | | |
|---|---|---|---|
| 4,105,861 | 8/1978 | Hascoe | 257/668 |
| 4,594,770 | 6/1986 | Butt | 437/219 |
| 4,629,824 | 12/1986 | Gilder, Jr. et al. | 257/674 |
| 4,721,994 | 1/1988 | Mine et al. | 257/671 |
| 4,784,972 | 11/1988 | Hatada | 257/780 |
| 4,796,078 | 1/1989 | Phelps, Jr. et al. | 257/668 |
| 4,827,376 | 5/1989 | Voss | 361/708 |
| 4,849,857 | 7/1989 | Butt et al. | 257/668 |
| 4,888,449 | 12/1989 | Crane et al. | 174/52.4 |
| 4,897,508 | 1/1990 | Mahulikar et al. | 257/708 |
| 4,939,316 | 7/1990 | Mahulikar et al. | 174/52.4 |
| 5,008,776 | 4/1991 | Queyssac | 257/691 |
| 5,013,871 | 5/1991 | Mahulikar et al. | 174/52.4 |
| 5,025,114 | 6/1991 | Braden | 257/676 |
| 5,034,591 | 7/1991 | Fang | 257/668 |
| 5,073,521 | 12/1991 | Braden | 257/699 |
| 5,086,337 | 2/1992 | Noro et al. | 257/726 |
| 5,132,773 | 7/1992 | Braden et al. | 257/702 |
| 5,173,766 | 12/1992 | Long et al. | 257/668 |
| 5,214,307 | 5/1993 | Davis | 257/666 |
| 5,220,195 | 6/1993 | McShane et al. | 257/666 |
| 5,239,131 | 8/1993 | Hoffman et al. | 257/687 |
| 5,250,839 | 10/1993 | Katoh et al. | 257/666 |
| 5,250,842 | 10/1993 | Ikeda | 257/668 |

FOREIGN PATENT DOCUMENTS

0136311  6/1993  Japan ..................... 257/668

Primary Examiner—Robert P. Limanek
Assistant Examiner—Alexander Oscar Williams
Attorney, Agent, or Firm—Gregory S. Rosenblatt

[57] ABSTRACT

There is provided a base for an electronic package. The base includes a peripheral portion for a polymer adhesive and a central portion for one or more semiconductor devices. A lead support is adjacent the substrate and located between the peripheral portion and the central portion. When a polymer adhesive bonds a leadframe to the package base, the lead support prevents deflection of the inner lead tips.

34 Claims, 6 Drawing Sheets

ELECTRONIC PACKAGE HAVING IMPROVED WIRE BONDING CAPABILITY

CROSS-REFERENCE TO RELATED APPLICATIONS

This patent application is a continuation of U.S. patent application Ser. No. 08/227,754 entitled "Electronic Package Having Improved Wire Bonding Capability" by Paul R. Hoffman et al that was filed on Apr. 14, 1994, now abandoned.

BACKGROUND OF THE INVENTION

This invention relates to electronic packages to house one or more microelectronic devices such as silicon based semiconductor chips. More particularly, the inner lead tips of a leadframe are supported to prevent deflection during wire bonding.

Electronic packages provide environmental protection for the delicate circuitry formed on a face of a semiconductor device. The packages also provide electrical interconnection between the circuitry and external circuits, typically through a leadframe or terminal pins. One electronic package has a metallic base and cover, the combination defining a cavity. A leadframe is disposed between the base and cover and adhesively bonded to both. A semiconductor device is supported on either a centrally positioned leadframe paddle or directly on the package base. Electrical interconnection between the device and the leadframe is by small diameter bond wires. This type of package is illustrated in U.S. Pat. Nos. 4,897,508 and 4,939,316, both by Mahulikar et al and both incorporated by reference in their entireties herein.

The leadframe is a thin, typically on the order of 0.15 mm to 0.25 mm (0.006–0.010 inch), metallic strip formed from copper or an iron-nickel alloy. The metallic strip is patterned into a plurality of leads with inner lead portions approaching a central aperture and outer lead portions extending outward from the central aperture for electrical interconnection to external circuitry.

In some leadframes, the central aperture contains a paddle formed from the same metallic strip as the leadframe and supported by outward running tie bars. The paddle facilitates assembly of the package. A semiconductor device is mounted to the paddle and small diameter bond wires electrically interconnect the device to the leadframe. The leadframe assembly is not yet housed within the electronic package and the inner leads are supported by external fixturing to prevent deflection during wire bonding.

Other leadframes do not include this centrally positioned paddle and the semiconductor device is bonded directly to the base of the electronic package. The inner lead portions are supported by a polymer adhesive. When this polymer adhesive is cured, nonuniform adhesive height can develop leading to a loss of lead coplanarity. Excess polymer resin can bleed on to the inner lead tips making wire bonding difficult. After the polymer cures, and wire bonding is commenced, the heat and pressure of bonding can deform the adhesive, deflecting the inner leads. Inner lead deflection leads to a poor wire bond or a short circuit.

In electronic package configurations lacking a die attach paddle, there remains a need for an improved electronic package base to prevent inner lead deflection during wire bonding.

SUMMARY OF THE INVENTION

Accordingly, it is an object of the invention to provide a base assembly for an electronic package which has improved wire bonding capability. A feature of the invention is a lead support extending from the package base to support the inner lead portions. The lead support is either mounted on the base or an integral protrusion of the base. The lead support can be formed from a rigid polymer, a ceramic or an insulated metal.

An advantage of the base assembly of the invention is that the inner lead portions do not deflect during wire bonding. The base assembly is particularly suited for aluminum bond wires leading to increased wire bond density and increased current carrying capacity. Another advantage is that the package does not require a die attach paddle for effective wire bonding improving the dissipation of heat from the device through the base.

In accordance with the invention, there is provided an electronic package base assembly. The base assembly includes a substrate having a peripheral portion and a central portion. A lead support is adjacent the substrate and disposed between the peripheral portion and the central portion.

In a second embodiment of the invention, there is provided an electronic package. The package has a base with a peripheral portion and a central portion. The electronic package includes a window frame having first and second opposing sides. A leadframe is disposed between the base and the first side of the window frame with an intermediate portion of the leadframe bonded to both the first side of the window frame and to the peripheral portion of the base. A lead support is disposed between the base and an inner lead portion of the lead frame. This lead support has a height effective to maintain the inner and intermediate portions of the leadframe in substantial coplanarity.

The above stated objects, features and advantages will become more apparent from the specification and drawings which follow.

DETAILED DESCRIPTION

Figure 1:
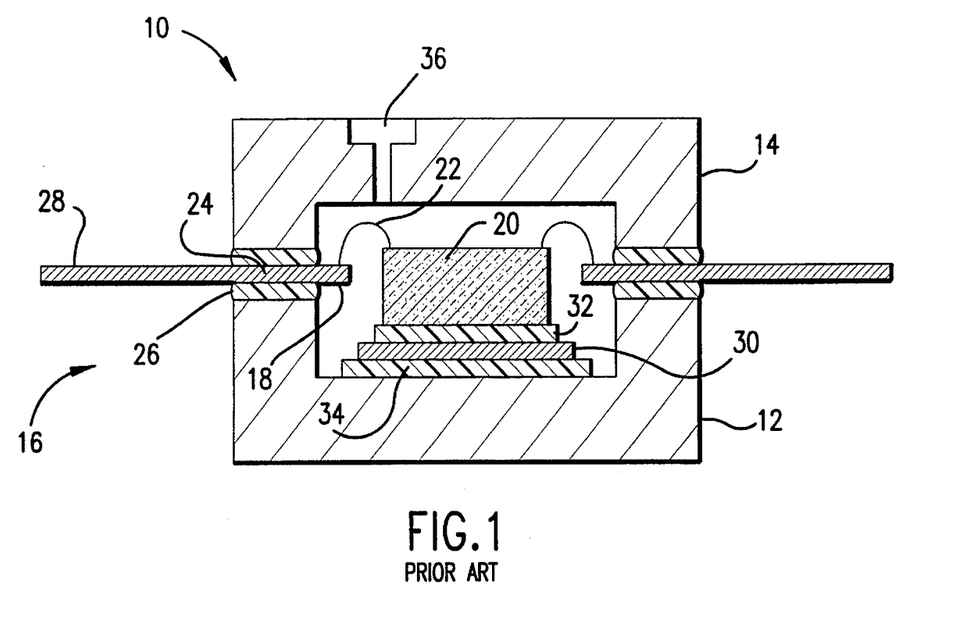
FIG. 1 shows in cross-sectional representation an electronic package as known from the prior art.

An electronic package incorporating a die attach paddle, as known from the prior art, is illustrated in FIG. 1. The metal electronic package 10 has a base 12 and a cover 14. Disposed between the base 12 and the cover 14 is a leadframe 16. The leadframe 16 is typically formed from copper, a copper alloy or an iron/nickel alloy. The leadframe 16 has a plurality of leads disposed about a central aperture. The leads may be arbitrarily divided into three portions:

(1) an inner lead portion 18 for electrical interconnection to a semiconductor device 20 by wire bonds 22;

(2) an intermediate lead portion 24 bonded to the peripheral portion of the base 12 and cover 14 by a polymer adhesive 26; and (3) an outer lead portion 28 for soldering to external circuitry such as a printed circuit board.

The semiconductor device 20 is mounted on a centrally positioned die attach paddle 30 by a die attach 32. Conventional die attach 32 materials are electrically conductive polymers and low melting temperature solder. During package assembly, the semiconductor device 20 is first mounted to the die attach paddle 30. Wire bonds 22 then electrically interconnect the inner lead portions 18 of the leadframe 16 with input/output pads formed on the electrically active face of the semiconductor device 20. The leadframe is not yet incorporated into an electronic package and the inner lead portions 18 may be supported by an external fixture to prevent lead deflection during wire bonding. The assembly is then bonded to a package base 12 by a pad attach 34. Typically pad attach 34 materials include electrically insulating, thermally conductive adhesives such as a thermosetting epoxy.

To minimize thermal degradation of the polymer adhesives, the die attach paddle 30 is bonded to the package base 12 concurrent with the leadframe 16 being bonded to both the base 12 and cover 14. As the polymer adhesives 26 and pad attach adhesive 34 cure, volatile compounds are given off. Some volatile compounds, such as chloride ions, become corrosive when combined with moisture. Accordingly, a vent hole 36 provides an egress for the volatiles following package assembly. After the adhesives are completely cured, a plug (not shown) seals the vent hole 36. Since some volatile components may remain in the package cavity, the wire bonds 22 are formed from gold or a gold alloy to reduce corrosion.

Figure 2:
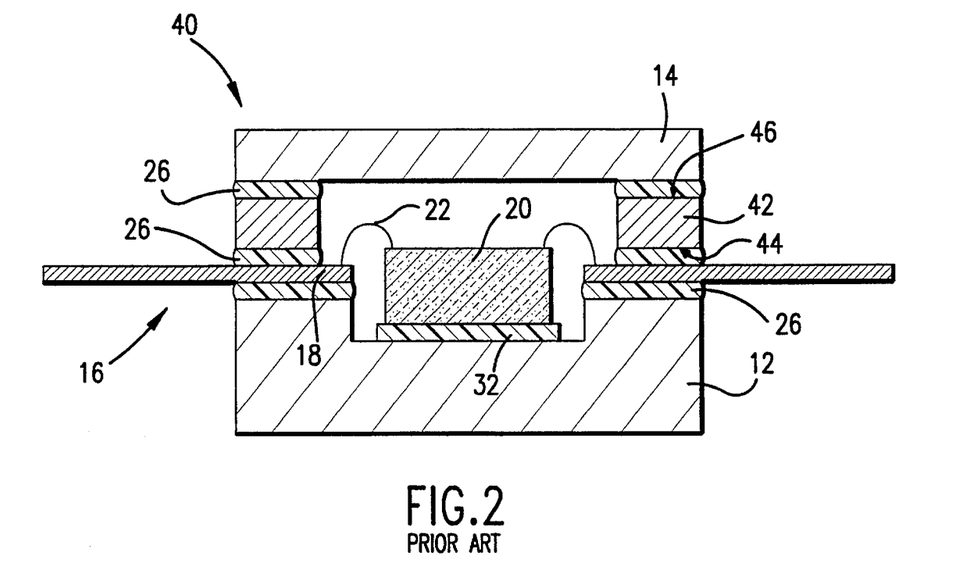
FIG. 2 shows in cross-sectional representation a window frame metal package as known from the prior art.

The window frame package 40 illustrated in FIG. 2, as known from the prior art, eliminates both the vent hole and the die attach paddle. A leadframe 16 is disposed between a base 12 and a window frame 42. The window frame 42 is an open rectangular structure having opposing first 44 and second 46 surfaces. The leadframe 16 is bonded by a polymer adhesive 26 to both the package base 12 and to the first surface 44 of the window frame 42. The polymer adhesive 26 also bonds a cover 14 to the second surface 46 of the window frame 42.

A semiconductor device 20 is mounted directly to the base component 12 by die attach 32 or mounted on a die attach paddle and attached to the package base through a pad attach.

When the semiconductor device 20 is mounted directly to the base 12, thermal dissipation through the package base is enhanced because the pad attach adhesive, a poor thermal conductor has been eliminated. Assembly of the window frame package 40 begins with bonding of the leadframe 16 to the package base 12 and to the first surface 44 of the window frame 42. The semiconductor device 20 is then bonded to the package base 12 by die attach 32. Next, the inner lead portions 18 are electrically interconnected to the semiconductor device 20 by wire bonds 22. Finally, the cover 14 is bonded to the second surface 46 of the window frame 42.

The cover 14 is attached after the adhesive cure is complete and fewer volatiles are trapped within the window frame package 40. The presence of corrosives within the package cavity is reduced and aluminum, copper or alloys thereof bond wires can be employed. There are many advantages to the use of copper or aluminum based bond wires rather than gold. In addition to cost, aluminum and copper can carry a higher current per wire cross-sectional area than gold permitting more power to be delivered to the device. The inner lead portions of a lead frame are frequently coated with an aluminum layer to facilitate wire bonding. Gold wire bonds are susceptible to the formation of a brittle aluminum-gold intermetallic (commonly referred to as "purple plague"). Aluminum bond wires bonded to an aluminum layer are immune to intermetallic formation.

Gold bond wires are usually bonded thermosonically, forming a gold ball at the bond site. Aluminum bond wires can be bonded utilizing ultrasonics that form a narrow wedge at the bond site. The smaller pitch of the aluminum wedge increases the bond site density.

A problem with the window frame package 40 is that the inner lead portion 18 is supported by the polymer adhesive 26. It is difficult to maintain lead coplanarity when the inner lead portions are supported by the adhesive. Additionally, if the adhesive volume is not accurately controlled, excess adhesive can bleed on to the inner lead portions making wire bonding difficult.

During wire bonding, the polymer adhesives, such as thermosetting epoxies, are not rigid, particularly at elevated wire bonding temperatures where the localized temperature can be in excess of 240° C. The inner lead portions 18 frequently deflect during wire bonding. The deflection weakens the wire bond strength and a deflected lead may contact an adjoining lead leading to an electrical short circuit. These problems are eliminated by utilizing the electronic package of the invention as illustrated in FIG. 3.

Figure 3:
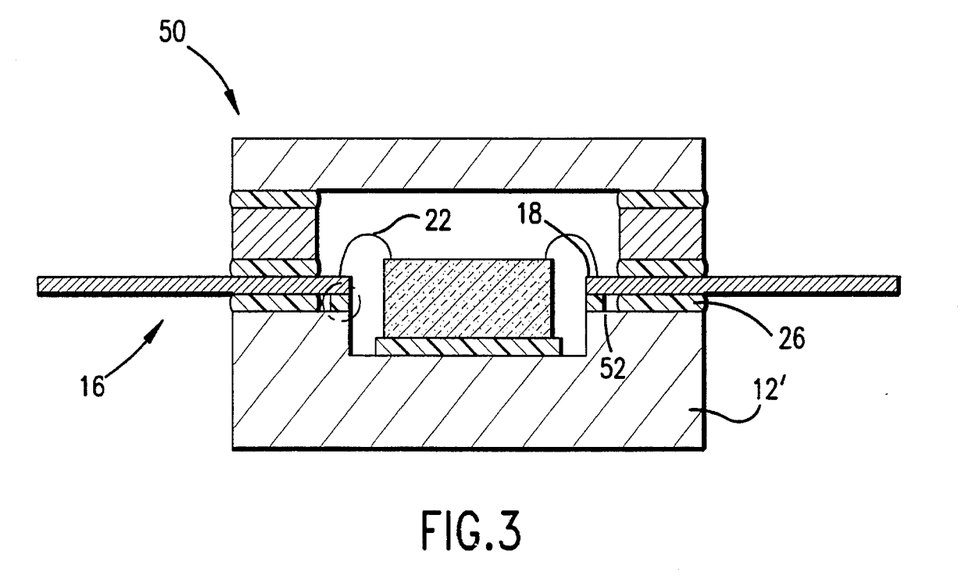
FIG. 3 shows in cross-sectional representation a window frame package in accordance with the present invention.

FIG. 3 shows in cross-sectional representation a window frame package 50 in accordance with the present invention. Many of the components of the window frame package 50 are similar to the components of the window frame package 40 of FIG. 2 and for like elements, the same reference numerals are utilized. Where related components perform a similar function, primed reference numerals are employed. Deflection of the inner lead portion 18 of the leadframe 16 during bonding of the wire bonds 22 is prevented by the lead support 52.

Figure 11:
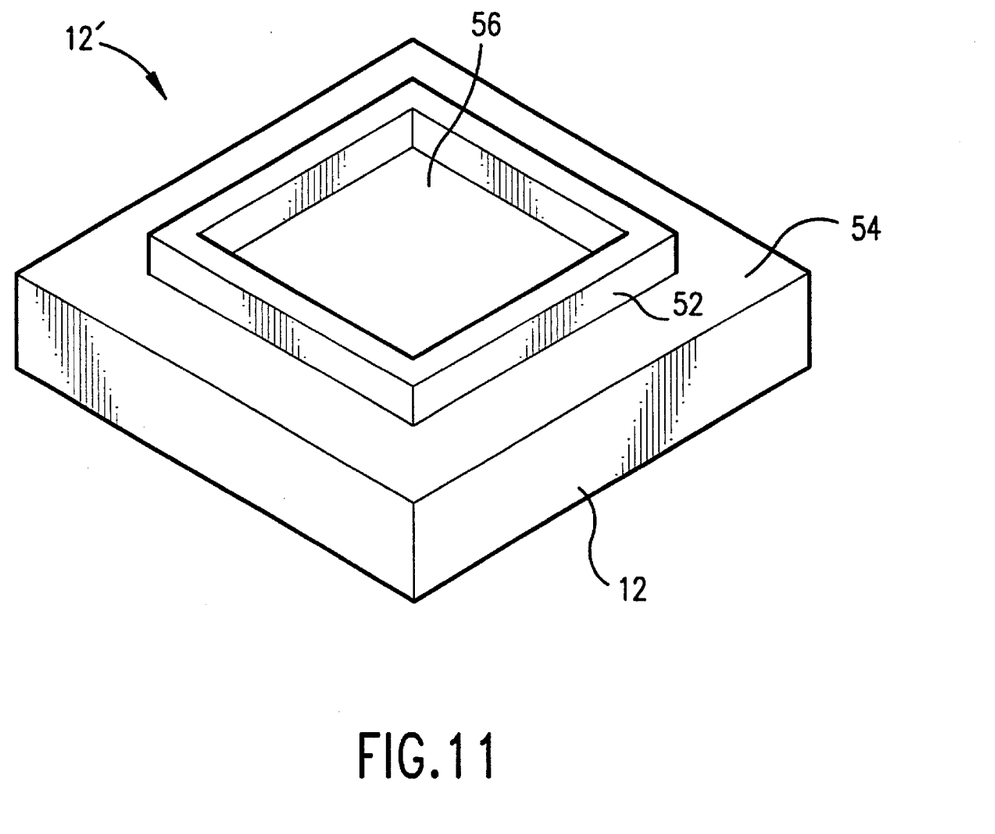
FIG. 11 shows in top isometric view the positioning of the lead support of the invention.

The package base assembly 12', best illustrated in top isometric view in FIG. 11, includes a substrate, corresponding to the base 12, having a peripheral portion 54 and a central portion 56. The peripheral portion 54 is adapted to receive a polymer adhesive for bonding to a leadframe. The central portion 56 is adapted to receive either a die attach or a pad attach. Adjacent the substrate and disposed between the peripheral portion 54 and the central portion 56 is the lead support 52.

The substrate is formed from any suitable material which provides sufficient mechanical and environmental support to protect the fragile semiconductor device. Suitable substrate materials include metals, polymers and ceramics as well as composites and compounds incorporating these materials. Metals such as copper, aluminum and alloys thereof are particularly preferred. The high thermal conductivity of these metals is very effective in dissipating heat generated by the device.

With reference back to FIG. 3, the lead support 52 has a height about equal to the thickness of the polymer adhesive 26 after the leadframe 16 is bonded to maintain the inner lead portion 18 and the intermediate portion 24 of the leadframe 16 in substantial coplanarity after the polymer adhesive is cured. Typically, the height of the lead support 52 is from about 0.1 mm to about 0.5 mm (0.004–0.020 inch). The lead support 52 is formed from any rigid material which will not deflect under the temperatures and pressures conventionally encountered during wire bonding.

The material selected for the lead support has sufficient rigidity to resist deflecting more than about 0.075 mm (0.003 inch) during wire bonding. Preferably, the deflection is less than about 0.025 mm (0.001 inch). To achieve these objectives, the yield strength of the lead support 52 is in excess of about 130 MPa (20,000 psi) and preferably from about 130 MPa to about 552 MPa (80,000 psi).

The lead support is formed from an electrically insulating material such as a polymer or ceramic. Alternatively, metallic materials such as metals, metal alloys or metal compounds are useful when electrically isolated as described below.

Figure 4:
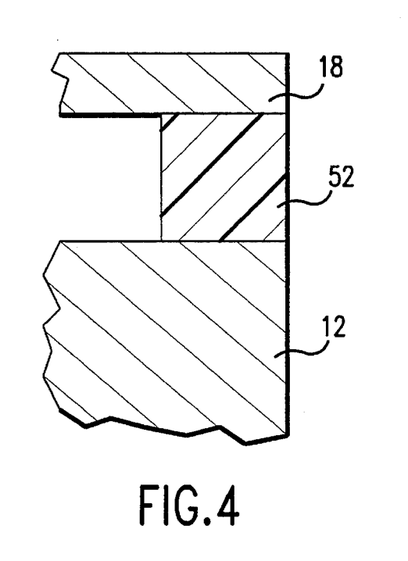
FIG. 4 shows a polymeric lead support in accordance with an embodiment of the invention.

FIGS. 4 through 7 illustrate various embodiments of the lead support 52. In FIG. 4, the lead support 52 is formed from a rigid polymer adhesive such as a polyimide, a polyetheretherketone ("PEEK") or a polyethersulfone. The rigid polymer adhesive bonds the inner lead ends 18 to the package base 12 for increased rigidity.

Figure 5:
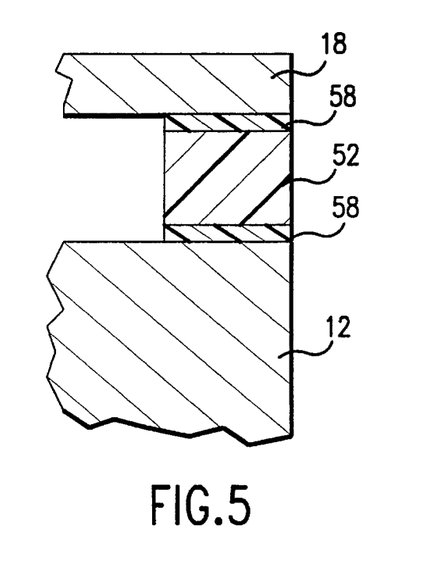
FIG. 5 shows in cross-sectional representation a polymeric lead support in accordance with another embodiment of the invention.

In FIG. 5, the lead support 52 is a rigid polymer such as polyethersulfone or polyetheretherketone bonded to both the inner leads 18 and the package base 12 by a polymer adhesive 58. A suitable polymer adhesive for bonding the lead support to a metallic base 12 and metallic inner lead portion 18 is a thermosetting epoxy such as "ABLESTIK 550" (Ablestik Laboratories, Gardenia, Calif.). The polymer adhesive 58 is much thinner than adhesives used to bond a leadframe to a package base so the problem of loss of lead coplanarity and polymer resin bleed out is minimized.

Figure 6:
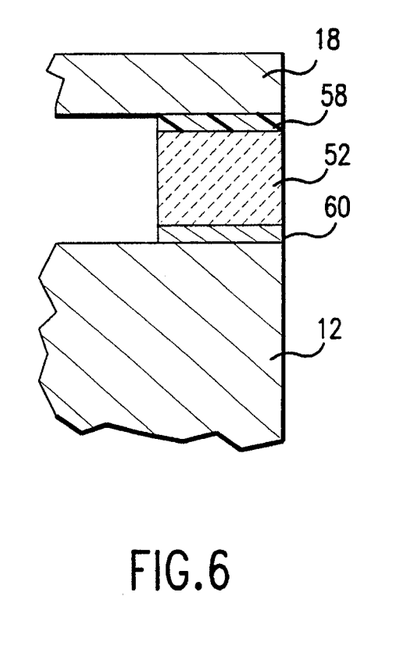
FIG. 6 shows in cross-sectional representation a ceramic lead support in accordance with an embodiment of the invention.

In FIG. 6, the lead support 52 is a ceramic such as aluminum oxide, silicon carbide or aluminum nitride. An electrically insulating, thermally conductive material such as aluminum nitride is preferred. The ceramic lead support 52 is bonded to the inner lead portion 18 and package base 12 by any suitable means such as a braze compound 60 or a polymer adhesive 58. When a braze compound 60 is utilized, the ceramic lead support 52 may be metallized and then brazed with a conventional braze such as a silver/copper alloy or a reactive metal braze such as a silver/copper/titanium alloy may be utilized for direct bonding to the ceramic. A suitable polymer adhesive 58 may also be utilized.

Figure 7:
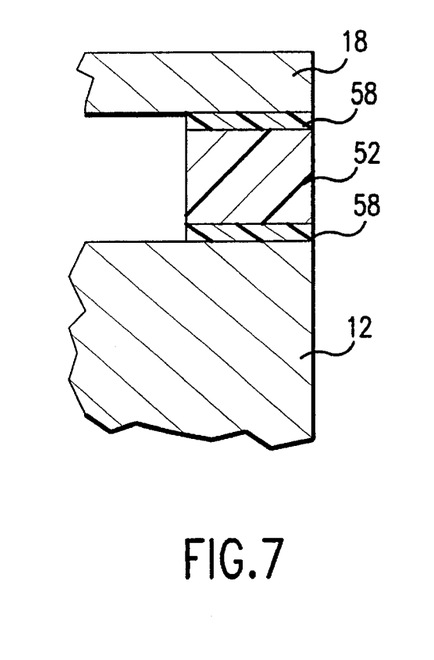
FIG. 7 shows in cross-sectional representation an insulated metallic lead support in accordance with another embodiment of the invention.

Referring to FIG. 7, the lead support 52 may be metallic which improves the conduction of heat from the inner leads 18 to the package base 12. To prevent an electrical short circuit, the lead support 52 is electrically isolated from the inner lead portion 18, and optionally from the package base 12 as well. Electrical isolation is provided by a polymer adhesive 58 or by applying a dielectric layer to at least one surface of the metallic lead support 52 disposed between the base 12 and inner lead portion 18. When the metallic lead support 52 is aluminum or an aluminum alloy, the surfaces of the lead support can be anodized to provide electrical isolation.

Figure 8:
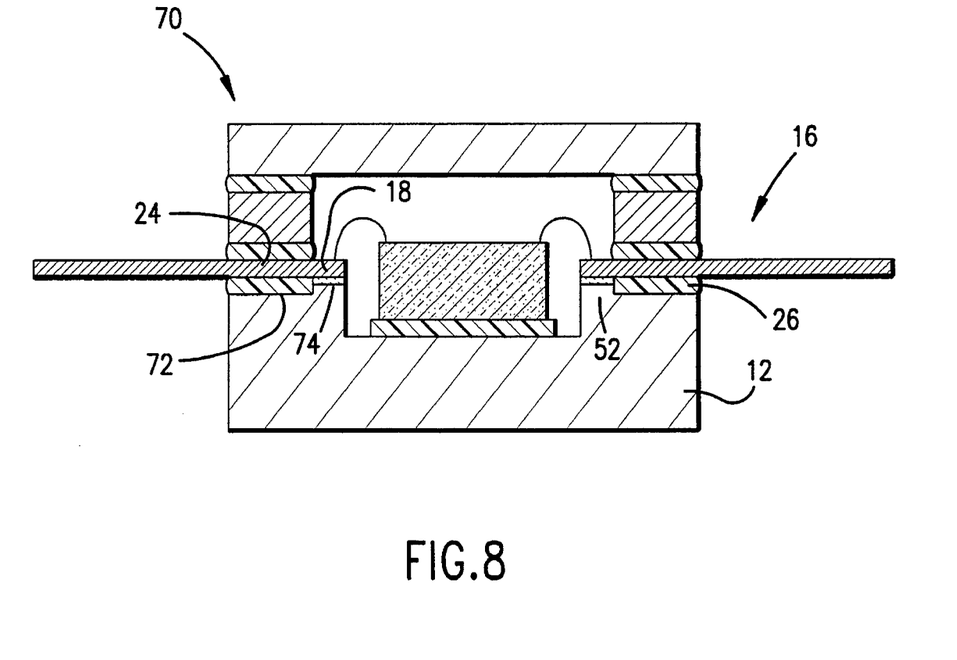
FIG. 8 shows in cross-sectional representation a metal electronic package having a unitary lead support in accordance with an embodiment of the invention.

The lead support can be unitary with the substrate 12 as illustrated in FIG. 8. A groove 72 is formed around the perimeter of the base 12 by a suitable process such as milling. The depth of the groove 72 is that effective to receive the polymer adhesive 26. The groove 72 should have a depth such that when the polymer 26 bonds the base 12 to the leadframe 16, substantial coplanarity is maintained between the inner lead portion 18 and the intermediate portion 24. To prevent the lead support 52 from creating an electrical short with the leadframe 16, a dielectric layer 74 is disposed between the leadframe support 52 and inner lead portion 18. The dielectric layer 74 may be a coating, such as a polymer layer or integral with the base material 12. When the base is aluminum or an aluminum alloy, anodized aluminum is an effective dielectric layer. The depth of the channel 72 is adjusted to compensate for the thickness of the dielectric layer 74 to provide substantial coplanarity.

Figure 9:
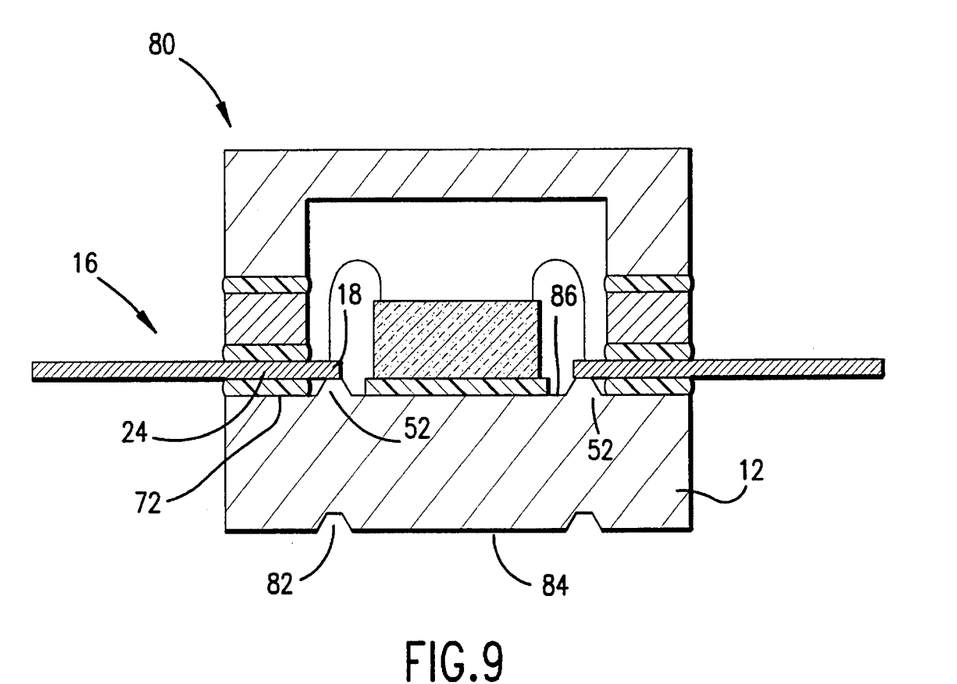
FIG. 9 shows in cross-sectional representation an electronic package having a unitary lead support in accordance with another embodiment of the invention.

Rather than milling or other subtractive process to form the channel 72, the lead support 52 may be formed by coining or other metal deformation processes. Since no metal is removed, there is no costly metal scrap. FIG. 9 illustrates an electronic package 80 in which a peripheral channel 72 is formed around the base 12 by coining a groove 82 into an outermost surface 84 of the base 12. By controlling the metal flow during coining, a lead support 52 is formed protruding from the opposing surface 86 of the base 12. The height of the protruding lead support 52 is that effective to maintain substantial coplanarity between the inner lead portion 18 and the intermediate lead portion 24 when the polymer adhesive 26 bonds the leadframe 16 to the base 12. A dielectric layer is preferably disposed between the inner lead 18 and lead support 52 to prevent an electrical short circuit.

Figure 10:
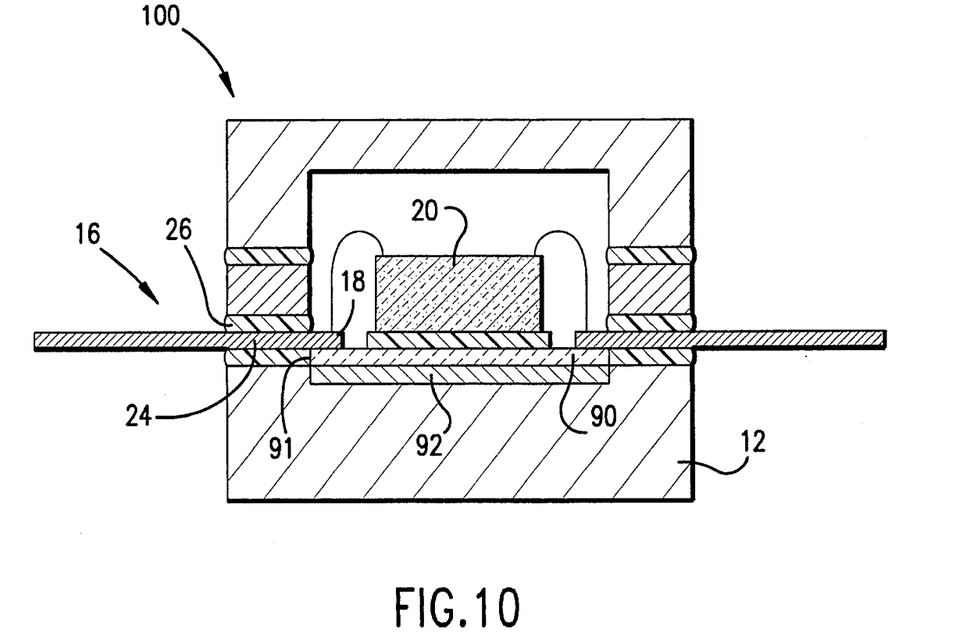
FIG. 10 shows in cross-sectional representation an embodiment of the invention in which the lead support extends beneath the semiconductor device.

To maintain lead coplanarity, it is not necessary to recess the polymer adhesive. In an embodiment illustrated in FIG. 10, a rigid dielectric frame 90 overlies the central portion of the substrate 12 of an electronic package 100. The peripheral edge 91 of the rigid dielectric frame 90 is adjacent the peripheral portion of the substrate underlying the inner lead portions 18. The rigid dielectric layer 90 may be any non-conductive substrate and extends beneath the semiconductor device 20 and the inner lead end portions 18 of the leadframe 16. Alternatively, the rigid dielectric layer is an electrically conductive material having an electrically insulating material adjacent at least those surfaces contacting the inner lead portions 18. The thickness of the rigid dielectric 90 is that effective to maintain substantial coplanarity between the inner lead ends 18 and the intermediate portion 24 of the leadframe 16 when polymer adhesive 26 is cured. While the rigid dielectric layer 90 may be any suitable material, including a metal coated with an insulating layer, the preferred materials are high thermal conductivity ceramics having a coefficient of thermal expansion approximately matching that of the semiconductor device 20. Suitable material include alumina (aluminum oxide), aluminum nitride, aluminum carbide, diamond, diamond-like (amorphous carbon) materials, silicon carbide, silicon nitride, beryllia and low temperature cofired substrates such as glass/ceramics. The high thermal conductivity of aluminum nitride makes that material particularly preferred. The rigid dielectric layer is bonded to the base 12 by attach 92 which could be a polymer, sealing glass, or if the rigid dielectric layer 90 is metallized, a solder or braze.

Figure 12:
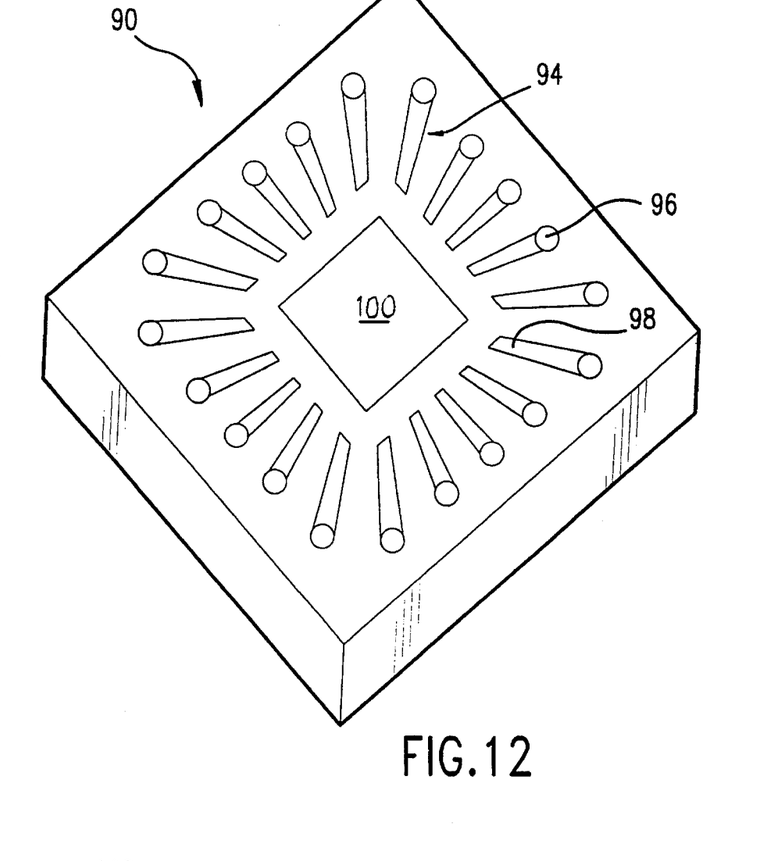
FIG. 12 shows in top isometric view the lead support of FIG. 10 further including a plurality of circuit traces.

FIG. 12 shows in top isometric view an alternative embodiment for the rigid dielectric layer 90. A plurality of circuit traces 94 are formed on a surface of the rigid dielectric layer 90 in accordance with any known method. For example, a palladium/nickel alloy could be applied in a desired pattern by screen printing and copper deposited on that metallization by electrolytic or electroless means. The circuit traces 94 have a outside termination end 96 for electrical interconnection to the inner lead portions of a leadframe. Electrical interconnection can be by soldering, a conductive adhesive or wire bonding.

The inside termination end 98 of the circuit traces 94 approach a central portion 100 of the rigid dielectric layer 100. The central portion 90 may be metallized to facilitate bonding of the semiconductor device. The inside termination ends 98 of the circuit traces 94 are then electrically interconnected to the semiconductor device such as by wire bonding or thin strips of copper foil as utilized in tape automated bonding.

Figure 13:
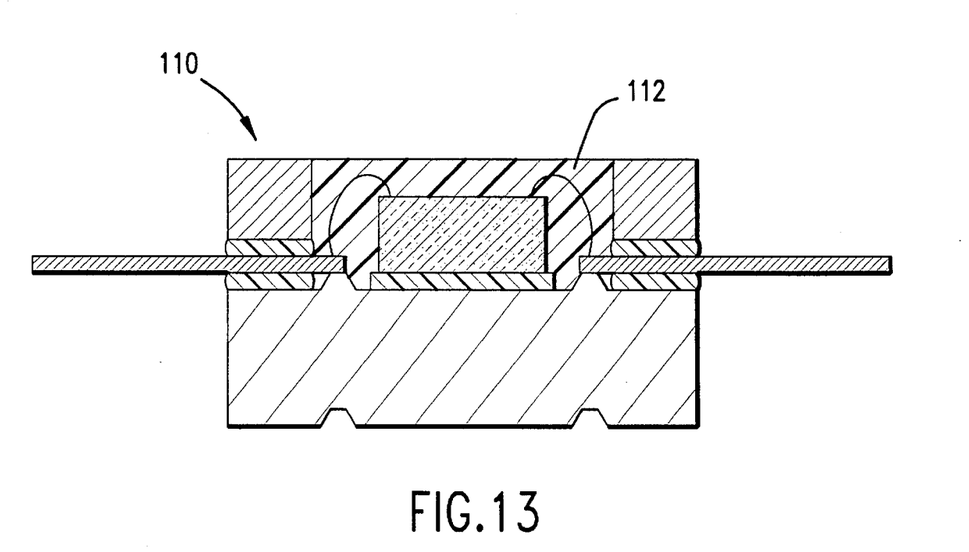
FIG. 13 shows in cross-sectional representation the electronic packages of the invention sealed with an epoxy portion compounds.

While the window frame package is illustrated with a cover 14, it is within the scope of the invention to fill the cavity defined by the base 12 and the window frame of any of the package assemblies with a potting compound such as an epoxy. This "lid free" package 110 is illustrated in cross sectional representation in FIG. 13. The potting compound 112 removes the requirement of a separate cover component resulting in the advantage of a reduced overall package thickness.

It is apparent that there has been provided in accordance with this invention a base for an electronic package which fully satisfies the objects, means and advantages set forth hereinbefore. While the invention has been described in combination with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. An electronic package base assembly, comprising:
   a substrate having a peripheral portion and a central portion;
   a polymer adhesive having a desired thickness bonded to said peripheral portion; and
   a rigid lead support adjacent said substrate and disposed between said polymer adhesive and said central portion, said lead support formed from a material selected from the group consisting of polymers that remain rigid at temperatures in excess of 240° C., ceramics and electrically isolated metallic materials and having a height about equal to the thickness of said polymer adhesive.

2. The electronic package base assembly of claim 1 wherein said lead support is bonded to said substrate.

3. The electronic package base assembly of claim 1 wherein said lead support is unitary with said substrate and an electrically insulating layer is adjacent at least one surface of said lead support.

4. The electronic package base assembly of claim 2 wherein said lead support is formed from an electrically insulating material.

5. The electronic package base assembly of claim 2 wherein said lead support is formed from an electrically conductive material having an electrically insulating layer adjacent at least one surface.

6. The electronic package base assembly of claim 5 wherein said electrically insulating layer is a polymer adhesive.

7. The electronic package base assembly of claim 3 wherein both said substrate and said lead support are formed from copper, aluminum or an alloy thereof.

8. The electronic package base assembly of claim 7 wherein said electrically insulating layer is a polymer adhesive.

9. The electronic package base assembly of claim 8 wherein said electrically insulating layer is anodized aluminum.

10. An electronic package base, comprising:
    a substrate having a peripheral portion and a central portion;
    a polymer adhesive having a desired thickness bonded to said peripheral portion; and
    a rigid lead support overlying said central portion and having a peripheral edge adjacent said peripheral portion, said lead support formed from a material selected from the group consisting of polymers that remain rigid at temperatures in excess of 240° C., ceramics and electrically isolated metallic materials and having a height about equal to the thickness of said polymer adhesive.

11. The electronic package base of claim 10 wherein said lead support is formed from an electrically insulating material.

12. An electronic package base comprising:
    a substrate having a peripheral portion and a central portion;
    a polymer adhesive having a desired thickness bonded to said peripheral portion; and
    an electrically insulating, rigid lead support overlying said central portion and having a peripheral edge adjacent to said peripheral portion, said lead support having a height about equal to the thickness of said polymer adhesive and formed from a ceramic material selected from the group consisting of alumina, aluminum nitride, silicon carbide, silicon nitride, aluminum carbide, diamond, diamond-like materials, beryllia and low temperature co-fired substrates.

13. The electronic package of claim 12 wherein conductive circuit traces are formed on said lead support.

14. The electronic package base of claim 10 wherein said lead support is formed from an electrically conductive material and an electrically insulating material is adjacent at least the peripheral portion of one surface.

15. An electronic package, comprising:
    a base having a peripheral portion and a central portion;
    a window frame having first and second opposing surfaces;
    a leadframe having a plurality of leads disposed about a central aperture, said leadframe disposed between said base and said window frame, an intermediate portion of each said lead bonded to both said first surface of said window frame and to said peripheral portion of said base by a polymer adhesive having a desired thickness; and
    a rigid lead support disposed between said central portion and said polymer adhesive, said lead support formed from a material selected from the group consisting of polymers that remain rigid at temperature in excess of 240° C., ceramics and electrically isolated metallic materials and having a height about equal to the thickness of said polymer adhesive.

16. The electronic package of claim 15 wherein said lead support is bonded to said base.

17. The electronic package of claim 15 wherein said lead support is unitary with said base and an electrically insulating layer is disposed between said lead support and said inner lead portion.

18. The electronic package of claim 16 wherein said lead support is formed from an electrically insulating material.

19. The electronic package of claim 16 wherein said lead support is formed from an electrically conductive material and an electrically insulating layer is disposed between said lead support and at least one of said base and said inner lead portion.

20. The electronic package of claim 17 wherein both said base and said lead support are formed from copper, aluminum or an alloy thereof.

21. The electronic package of claim 20 wherein said electrically insulating layer is anodized aluminum.

22. The electronic package of claim 15 further including a cover bonded to said second surface of said window frame.

23. The electronic package of claim 15 having a polymer potting compound filling the cavity defined by said base and said window frame.

24. An electronic package, comprising:

a base having a peripheral portion and a central portion;

a window frame having first and second opposing surfaces;

a leadframe having a plurality of leads disposed about a central aperture, said leadframe disposed between said base and said window frame, an intermediate portion of each said lead bonded to both said first surface of said window frame and to said peripheral portion of said base by a polymer adhesive having a desired thickness; and a lead support overlying said central portion and having a peripheral edge adjacent said peripheral portion, said lead support formed from a material selected from the group consisting of polymers that remain rigid at temperatures in excess of 240° C., ceramics and electrically isolated metallic materials and having a height about equal to the thickness of said polymer adhesive.

25. The electronic package of claim 24 wherein said lead support is bonded to said base.

26. The electronic package of claim 24 wherein said lead support is unitary with said base and an electrically insulating layer is disposed between said lead support and said inner lead portion.

27. The electronic package of claim 25 wherein said lead support is formed from an electrically insulating material.

28. An electronic package comprising:

a base having a peripheral portion and a central portion;

a window frame having first and second opposing surfaces;

a leadframe having a plurality of leads disposed about a central aperture, said leadframe disposed between said base and said window frame, an intermediate portion of each of said leads bonded to both said first surface of said window frame and to said peripheral portion of said base by a polymer adhesive having a desired thickness; and an electrically insulating lead support overlying and bonded to said central portion with a peripheral edge of said lead support being adjacent to said peripheral portion of said base, said lead support having a height about equal to the thickness of said polymer adhesive and formed from a ceramic material selected from the group consisting of alumina, aluminum nitride, silicon carbide, silicon nitride, aluminum carbide, diamond, diamond-like materials, beryllia and low temperature cofired substrates.

29. The electronic package of claim 28 wherein conductive circuit traces are formed on said lead support and said leadframe is electrically interconnected to said circuit traces.

30. The electronic package base of claim 26 wherein said lead support is formed from an electrically conductive material and an electrically insulating material is disposed between said lead support and at least one of said base and said inner lead portion.

31. The electronic package of claim 30 wherein both said base and said lead support are formed from copper, aluminum or an alloy thereof.

32. The electronic package of claim 31 wherein said electrically insulating layer is anodized aluminum.

33. The electronic package of claim 24 further including a cover bonded to said second surface of said window frame.

34. The electronic package of claim 24 having a polymer potting compound filling the cavity defined by said base and said window frame.

* * * * *